United States Patent [19]

Moustakas

[11] Patent Number: 4,804,583
[45] Date of Patent: Feb. 14, 1989

[54] COMPOSITION OF MATTER THAT IS HARD AND TOUGH

[75] Inventor: Theordore D. Moustakas, Annandale, N.J.

[73] Assignee: Exxon Research and Engineering Company, Florham Park, N.J.

[21] Appl. No.: 54,384

[22] Filed: May 26, 1987

[51] Int. Cl.$^4$ ............................................. B32B 15/04
[52] U.S. Cl. ................................... 428/469; 428/698; 428/699
[58] Field of Search ............... 428/469, 698, 699, 408, 428/701

[56] References Cited

U.S. PATENT DOCUMENTS

| Re. 28,485 | 7/1975 | Rix et al. | 428/698 |
|---|---|---|---|
| 4,066,821 | 1/1978 | Cook et al. | 428/698 |
| 4,264,682 | 4/1981 | Fuyama et al. | 428/698 X |
| 4,708,037 | 11/1987 | Bieljan et al. | 428/698 X |
| 4,713,286 | 12/1987 | Buntine et al. | 428/698 X |
| 4,728,579 | 3/1988 | Koenig | 428/698 X |

Primary Examiner—Nancy A. B. Swisher
Attorney, Agent, or Firm—Ronald D. Hantman

[57] ABSTRACT

Hard materials are generally not tough but they are brittle. Thin film superlattices made of a hard and a tough material or two hard materials having different lattice structure are resistant to crack propagation and are both hard and tough.

11 Claims, 4 Drawing Sheets

COMPOSITION OF MATTER THAT IS HARD AND TOUGH

BACKGROUND

Hard materials are generally not tough but they are brittle. The failure mechanism consists of crack initiation, mostly at dislocations, and crack propagation. In the present invention, new materials are disclosed which affects crack stopping and therefore leads to materials which are both hard and tough. The materials include a lamination of hard and tough materials in the form of thin films (superlattice). A crack initiated in any hard layer of the superlattice will stop when it reaches the tough layer. In a hard material, the crack will propagate all the way through. As used herein, a superlattice means a superposition of a different periodicity on to the lattice structure of the individual materials.

Multi-layer structures consisting of either pure metallic systems, such as Cu-Ni etc., or semiconductive systems such as GaAs-AlAs, have been widely studied. However, until the present invention, superlattices between hard refractory metal carbides and tough transition metals have not been studied.

SUMMARY OF THE INVENTION

The present invention is a composition of matter which includes alternating layers of a hard material and a tough metallic material that rests with the hard material. The hard material has a Wickers number greater than 2000 kg/mm$^2$.

Requirements for combination of the two materials forming the laminated structures are the following:
(i) There should be small interdiffusion between the two types of layers either during the film deposition or subsequent use. (Hard material very frequently used as cutting elements at elevated temperatures). This requirement necessitates the use of components of Eutectic systems to form the individual layers, and
(ii) The bonding between the layers of these structures should be chemical rather than physical in nature.

In the preferred embodiment, the composition includes hard materials such as refractory metal carbides (WC, B$_4$C etc.) and tough materials such as transition metals (Ni, Co etc.). These systems are known to be simple eutectics. A laminated system of metal carbides (hard material) and transition metal (tough material) will not interdiffuse until temperatures close to the eutectic (approximately 1000° C.).

Other embodiments for the layered material include diamond/transition metal, cubic boron nitride/transitions metal, and diamond/cubic boron nitride.

DESCRIPTION OF THE PREFERRED EMBODIMENT

Figure 1:
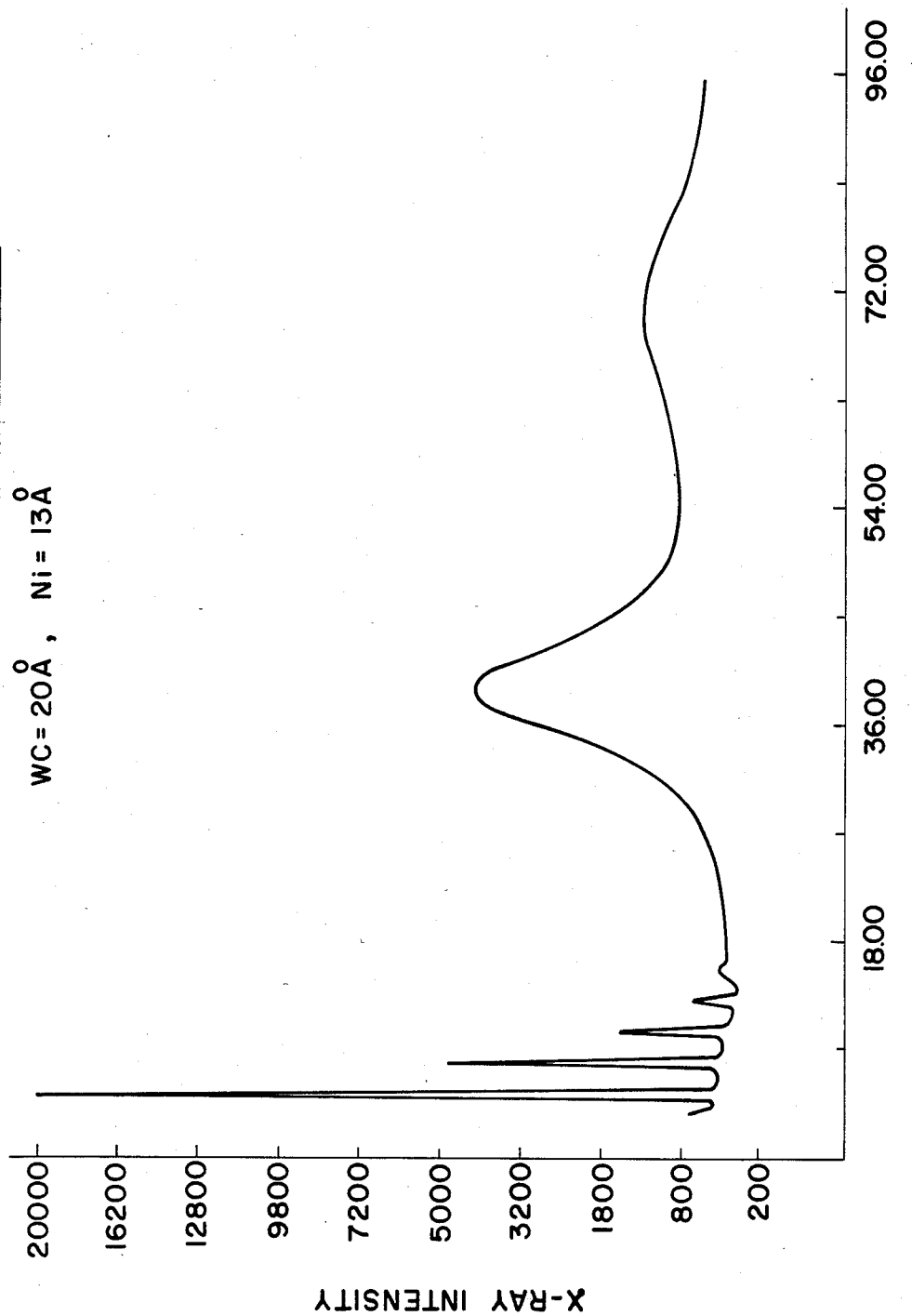
FIG. 1 shows the x-ray diffraction of a superlattice material (Ni-WC) of the present invention.

The present invention shall be illustrated and described with alternating layered superlattice of refractory metal carbides and transition metals.

The formation and stability of such superlattices depends on the structural compatibility of the two classes of materials, and the interfacial strength depends on the wetting properties of refractory metal carbides by the transition metals. The properties of such superlattices should bare resemblance with the family of cemented carbides (mixture of carbide and cobalt powders sintered at high temperatures), which combine the high hardness and wear resistance of the carbide phase with mechanical and thermal shock resistance of the metallic binder phase. However, contrary to the cemented carbides, whose micro-structure is coarsened due to grain growth and coalesence during the high temperature sintering, the superlattices can be formed at low temperatures leading to microstructures in the manoscale range with potential novel mechanical properties. In the present invention superlattices of tungsten carbide with nickel or cobalt are formed. In the present invention the formation and structure of superlattices of tungsten carbide with nickel and cobalt are disclosed.

Tungsten carbide can be formed in a bulk form under different phases such as face centered cubic (FCC), orthorombic, hexagonal, alpha tungsten carbide, and tungsten oxycarbide. The last phase is formed by interaction of tungsten oxide vapor with graphite at 1300° C. and has a FCC structure with a lattice constant $a_o = 4.24$A. This phase is considered as being a solid solution of the FCC tungsten oxide and the FCC tungsten carbide.

Cobalt can be formed in bulk form in two phases. Above 450° C. forms a FCC structure, while at room temperature forms a hexagonal close packed structure. Mixtures normally co-exist and pure cubic specimens can be retained at room temperature. The lattice constants of the cubic phase is $a_o = 3.5447$A and of the hexagonal close packed phase are $a_o = 2.507$A and $\lambda_o = 4.070$A.

Nickel forms always in FCC structure with lattice constant $a_o = 3.5238$A.

The wetting of transition metals on tungsten carbide was found to increase progressively from Ti to Cu. As a result, transition metals such as cobalt and nickel should wet the tungsten carbide and therefore form good superlattices.

EXPERIMENTAL METHODS

Tungsten carbide superlattices with nickel and cobalt were formed by RF diode sputtering, employing a multi-target deposition system with a rotating substrate table. The system was pumped by a combination of a turbo-molecular pump and a mechanical pump.

The tungsten carbide target was formed from WC powders compacted and sintered at elevated temperatures in an inert atmosphere. This process resulted in material having a density of 10.6 gr/cm$^3$, which is 69.5% of the theoretical density. The cobalt and the nickel targets were fabricated from sheet metal.

All targets, 12.7 cm in diameter and 0.64 cm thick, were water cooled and supplied with an RF power at a frequency 13.56 MH$_z$. For reproducing the deposition rate from each target the DC component of the target voltage was monitored.

The anode assembly, 66 cm in diameter, was held 6 cm below the targets and was electrically connected to ground and can be heated up to 600° C. The anode assembly was rotating sequentially under each target and its residence time was regulated to grow a certain layer thickness. Thus, two sets of superlattices were deposited simultaneously. The one set has the transition metal deposited first and the other has the tungsten carbide deposited first.

Prior to the formation of the superlattices thick films of tungsten carbide, nickel, and cobalt were deposited under similar deposition conditions as during the formation of the superlattices in order to establish the deposition rates and study the structure of the individual layers.

The structure of the films and superlattices was investigated by x-ray diffraction and transmission electron microscopy. X-rays were used to probe the formation of the superlattice by studying the harmonics of the Bragg diffraction at small angles and the size and orientation of the crystallites from the large angle scattering. These studies were done with Cu-Ka radiations. Transmission electron microscopy (TEM was used to study interface sharpness and the structure of the individual layers.

The structure of the tungsten carbide films was found to be similar to that of the tungsten oxycarbide or of beta tungsten carbide which are both face centered cubic with a lattice constant of about 4.24 Å.

The structure of the nickel film was found to be FCC as the bulk (thick) materials.

The structure of the cobalt films depends on the temperature of the deposition. Below 200° C., the film grows in hexagonal close-packed form. Above 350° C., the films grow in the FCC structure.

EXAMPLE 1 TUNGSTEN CARBIDE-NICKEL SUPERLATTICES

All tungsten carbide-nickel superlattices were deposited on room temperature substrates (quartz, 7059 glass, stainless steel, sapphire) and argon pressure 9m Torr. The superlattice structure adheres well in all substrates independent of which layer was deposited first. The x-ray diffraction of such a superlattice is shown in FIG. 1. This superlattice consists of 13A of Ni and 20A of WC. Besides the superlattice diffraction lines at low angles, which indicate that the superlattice was formed, there are two broad peaks at large angles, centered at 40° and 70°. These are diffraction peaks from the tungsten carbide and are broad because the material is either amorphous or made of very small crystallites. This disordered form of the tungsten carbide is due to the fact that each layer is only a few monolayers thick and it is highly strained due to the lattice mismatch at the interfaces. If the individual layers of the tungsten carbide are more than 50 A thick, then the peaks at 40° and 70° are sharp showing better crystallization of the material.

Figure 2:
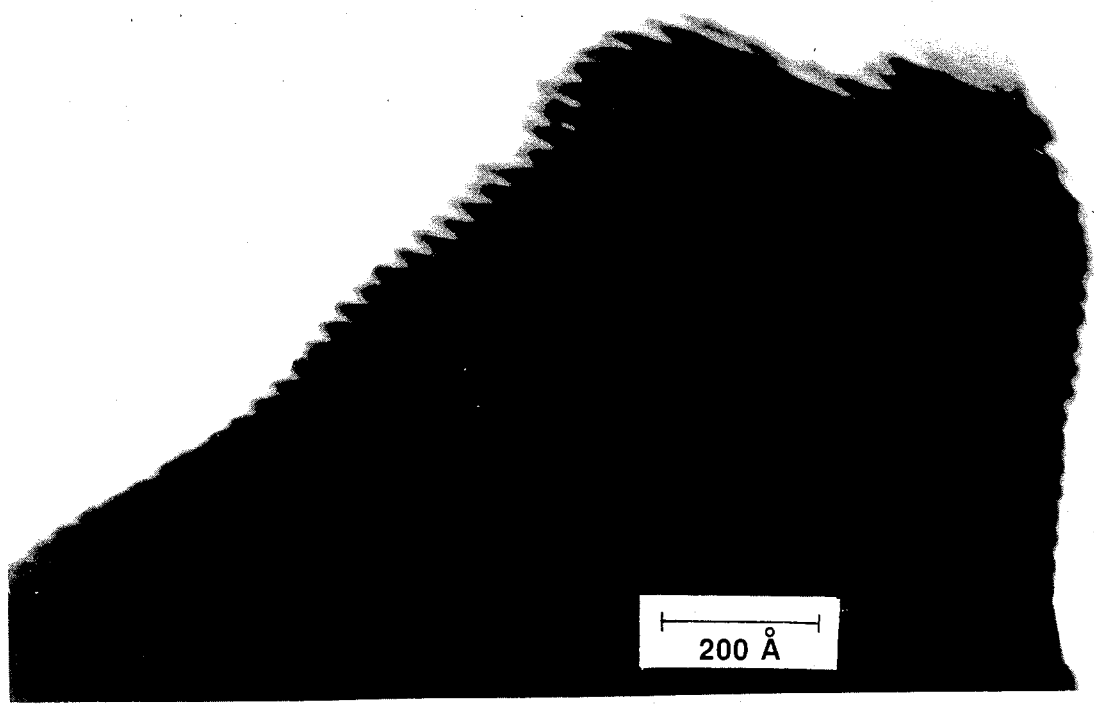
FIG. 2 shows a transmission electron micrograph (TEM) of a superlattice material (Ni-WC) of the present invention.

The sharpness of the interfaces of these superlattices was investigated by examining TEM images of thin sections. The TEM image of the superlattice, which was discussed previously, is shown in FIG. 2. According to these data the interfaces appear to be atomically abrupt.

EXAMPLE 2 TUNGSTEN CARBIDE-COBALT SUPERLATTICES

Figure 3:
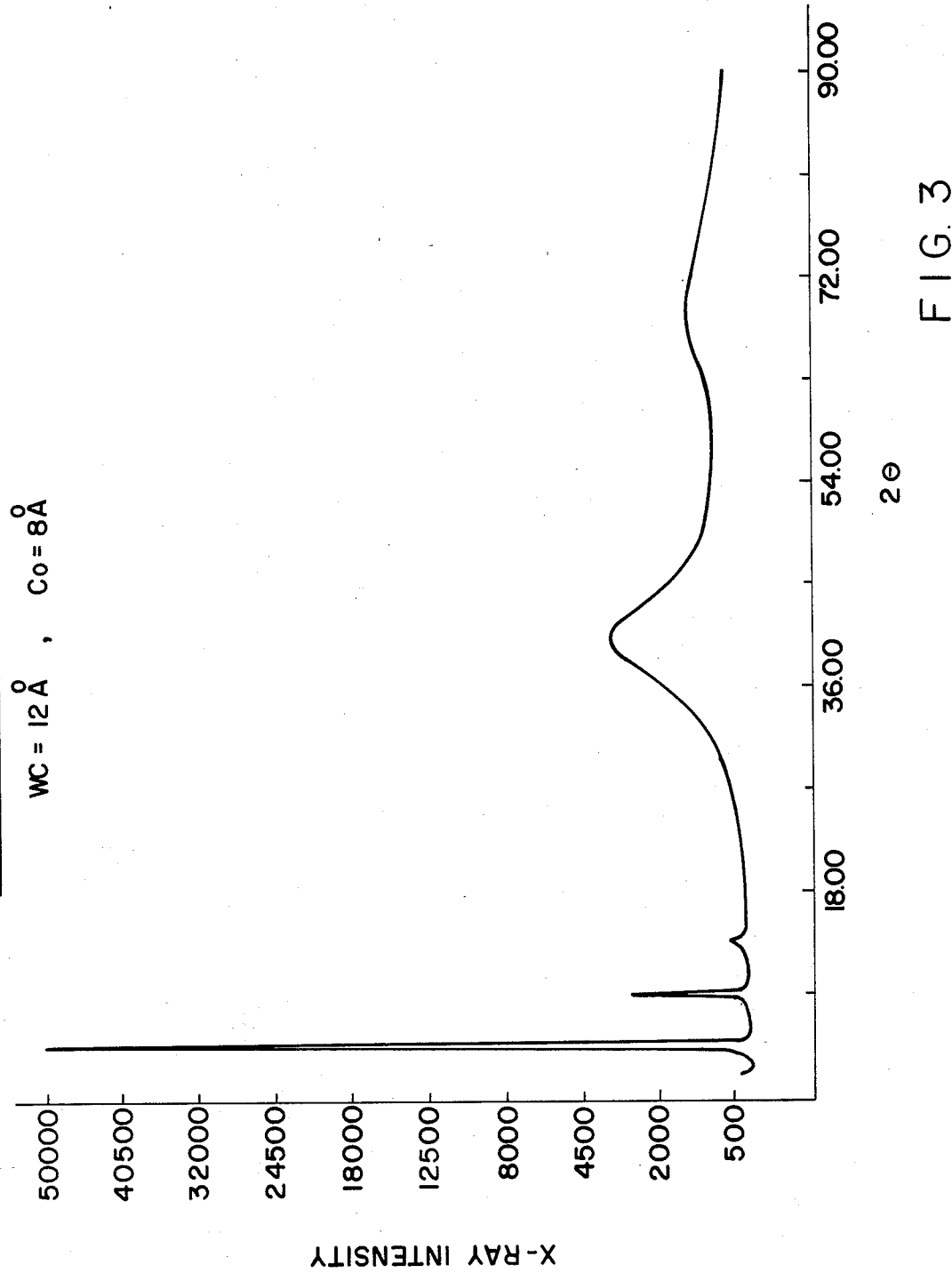
FIG. 3 shows the x-ray diffraction of a superlattice material (Co-WC) of the present invention.
Figure 4:
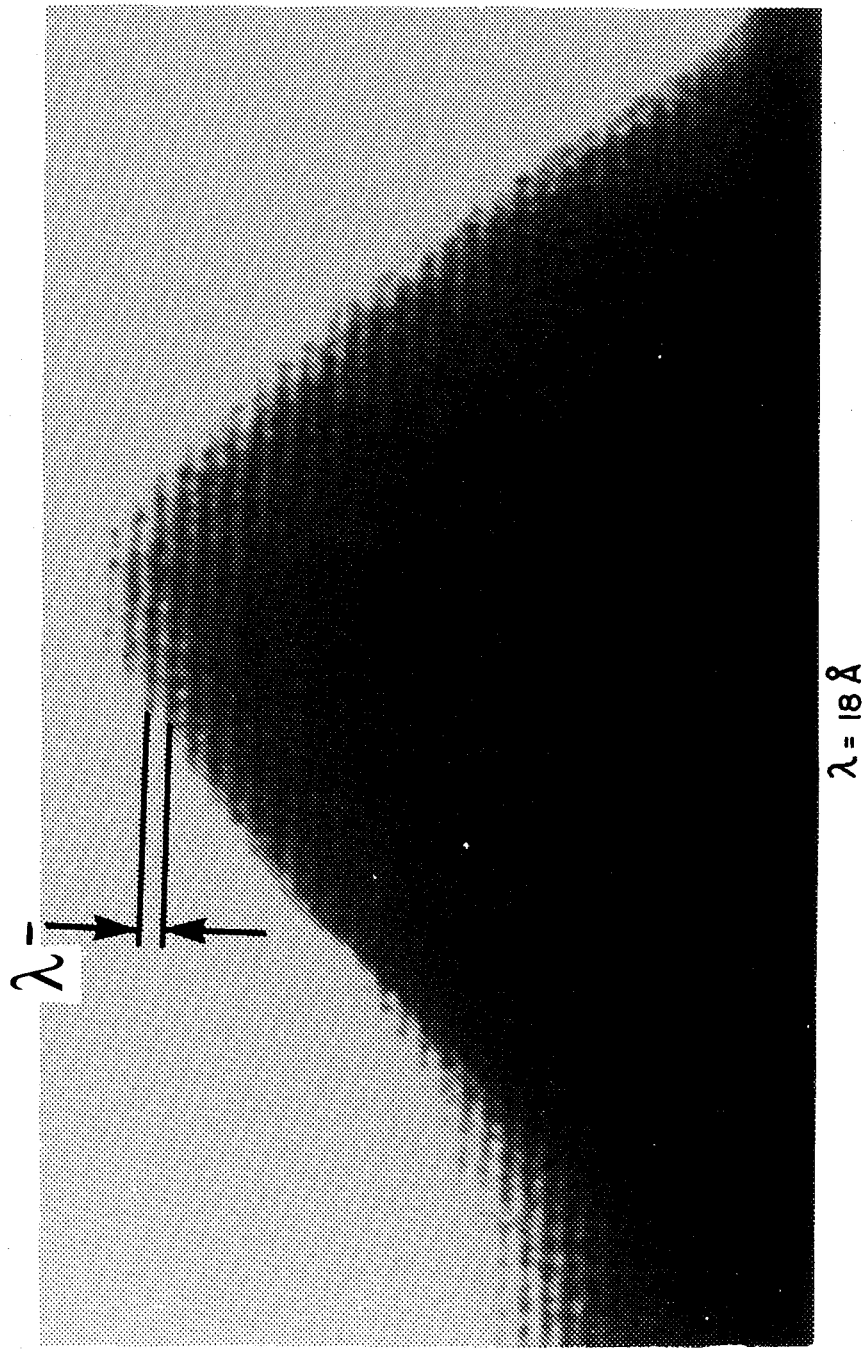
FIG. 4 shows transmission electron micrograph (TEM) of a superlattice material (Co-WC) of the present invention.

Superlattices of tungsten carbide and cobalt were also constructed. Such superlattices were deposited at 9m Torr of argon and substrate temperatures 50° C. and 320° C. on a variety of substrates (quartz, 7059 glass, stainless steel, sapphire). The superlattice structure adheres well in all substrates independent of which layer was deposited first. The x-ray diffraction of such a superlattice is shown in FIG. 3. This superlattice consists of 12A of WC and 8A of Co. Besides the superlattice diffraction lines at low angles, which indicate that the superlattice was formed, there are two broad peaks at large angles, centered at 40° and 70°. These peaks can be accounted for as the similar peaks in the superlattice of example 1. In a manner similar to the previous example, the sharpness of the interface of these superlattices was investigated by examining TEM images of thin sections. The TEM image of the superlattice, which was discussed previously, is shown in FIG. 4. According to these data the interfaces appear to be atomically abrupt. If the superlattice is grown at 50° C., the interfaces are atomically sharp. However, if the superlattice is grown at high temperatures (320° C.), the interfaces have average roughness of a few atomic layers.

What is claimed is:

1. A composition structure comprising a plurality of thin alternating layers of a first hard material with a Wicker's number larger than 2000 kg/mm$^2$ and a second tough metallic material that wets with said hard material, wherein said hard material is selected from the group consisting of a carbide, nitride or diamond, wherein said tough material is a transition metal and each of said layers have a thickness between 5A and 1000A.

2. The composition of claim 1 wherein said hard material is tungsten carbide.

3. The composition of claim 1 wherein said hard material is boron carbide.

4. The composition of claim 1 wherein said hard material is cubic boron nitride.

5. The composition of claim 1 wherein said hard material is titanium nitride.

6. The composition of claim 1 wherein said hard material is titanium carbide.

7. The composition of claim 1 wherein said tough material is cobalt.

8. The composition of claim 1 wherein said tough material is nickel.

9. The composition of claim 1 wherein said tough material is chromium.

10. The composition of claim 1 wherein said tough material is titanium.

11. The composition of claim 1 wherein said layers have a thickness between 10A and 50A.

* * * * *